(12) United States Patent
Rezzi et al.

(10) Patent No.: US 7,629,909 B1
(45) Date of Patent: Dec. 8, 2009

(54) CIRCUIT FOR CONVERTING A VOLTAGE RANGE OF A LOGIC SIGNAL

(75) Inventors: Francesco Rezzi, Cava Manara (IT); Nicola Ghittori, Pavia (IT); Giovanni Antonio Cesura, Cremona (IT); Shafiq M. Jamal, Gilroy, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/836,628

(22) Filed: Aug. 9, 2007

Related U.S. Application Data

(60) Provisional application No. 60/821,906, filed on Aug. 9, 2006.

(51) Int. Cl.
*H03M 1/00* (2006.01)
(52) U.S. Cl. ...................... 341/136; 341/144
(58) Field of Classification Search ................ 341/136, 341/144, 145, 150, 172; 327/540, 541, 542, 327/543, 538, 539; 326/83
See application file for complete search history.

(56) References Cited

U.S. PATENT DOCUMENTS

| | | | |
|---|---|---|---|
| 3,961,326 A | 6/1976 | Craven | |
| 4,825,099 A | 4/1989 | Barton | |
| 4,937,477 A | 6/1990 | Tsoi et al. | |
| 5,028,817 A | 7/1991 | Patil | |
| 5,128,556 A | 7/1992 | Hirakata | |
| 5,539,341 A | 7/1996 | Kuo | |
| 5,625,360 A | 4/1997 | Garrity et al. | |
| 5,751,186 A | 5/1998 | Nakao et al. | |
| 5,781,026 A | 7/1998 | Chow | |
| 5,900,741 A | 5/1999 | Roohparvar | |
| 5,909,187 A | 6/1999 | Ahuja | |
| 6,100,830 A | 8/2000 | Dedic | |
| 6,188,244 B1 * | 2/2001 | Joo et al. | ................ 326/83 |
| 6,339,344 B1 | 1/2002 | Sakata et al. | |
| 6,407,688 B1 | 6/2002 | Greig | |
| 7,023,367 B1 | 4/2006 | Manganaro | |
| 7,034,733 B2 | 4/2006 | Dedic et al. | |
| 7,355,449 B1 | 4/2008 | Tran et al. | |
| 7,432,741 B1 | 10/2008 | Shumarayev | |

OTHER PUBLICATIONS

U.S. Appl. No. 11/836,571, filed Aug. 9, 2007, Rezzi et al.
U.S. Appl. No. 11/836,584, filed Aug. 9, 2007, Rezzi et al.
U.S. Appl. No. 11/836,619, filed Aug. 9, 2007, Rezzi et al.
U.S. Appl. No. 11/836,635, filed Aug. 9, 2007, Rezzi et al.
U.S. Appl. No. 11/846,292, filed Aug. 28, 2007, Rezzi et al.
Office Action in U.S. Appl. No. 11/836,619, dated Oct. 29, 2008.
Interview Summary in U.S. Appl. No. 11/836,619, dated Nov. 10, 2008.
Office Action for U.S. Appl. No. 11/836,635 dated May 21, 2009.
Notice of Allowance for U.S. Appl. No. 11/836,584.

\* cited by examiner

*Primary Examiner*—Rexford N. Barnie
*Assistant Examiner*—Joseph Lauture

(57) ABSTRACT

In a circuit to convert a voltage range of a control signal, a first switch selectively couples, based on the control signal, an output node to a first reference voltage when the output node is to be in a first state. A second switch selectively establishes, based on the control signal, a second reference voltage when the output node is to be in a second state, the second state being a logical complement of the first state. A feedback control loop is coupled to the output node to maintain the second reference voltage in response to voltage fluctuation at the output node. The feedback control loop includes a current mirror and a transistor coupled to the current mirror. The transistor is controlled by feedback from the output node to modify a biasing current established by the current mirror to thereby counteract the voltage fluctuation.

22 Claims, 7 Drawing Sheets

CIRCUIT FOR CONVERTING A VOLTAGE RANGE OF A LOGIC SIGNAL

CROSS-REFERENCE TO RELATED APPLICATION

The present application claims the benefit of U.S. Provisional Application No. 60/821,906, entitled "DAC DRIVER With Feedback Control Loop," filed on Aug. 9, 2006, the contents of which are hereby incorporated by reference herein in its entirety.

FIELD OF TECHNOLOGY

The present disclosure relates generally to digital circuits, and more particularly, to circuits for converting signals that vary in a first voltage range to signals that vary in a second voltage range.

DESCRIPTION OF THE RELATED ART

Typical current steering digital-to-analog converters (DACs) comprise a plurality of cells, each cell selectively supplying a current to a current summing line based on the digital value that is to be converted. The total current selectively supplied by all of the cells corresponds to the digital value, and different digital values will result in different amounts of total current.

For instance, FIG. 1 is a block diagram of an example current steering DAC 100 having a plurality of cells 104, 108, 112, and 116. Each of the cells 104, 108, 112, 116 includes an output coupled to a current summing line 120. Digital data that is to be converted may be supplied to each of the cells 104, 108, 112, 116. Each of the cells 104, 108, 112, 116 cells includes a current source and a switch that selectively, based on the digital data, applies current from the current source to the summing line 120. The total current on the summing line 120 will correspond to the digital value, and different digital values will result in different amounts of total current on the summing line 120.

FIG. 2 is a block diagram of an example cell 150 that may be utilized in the current steering DAC 100 of FIG. 1. The cell 150 includes a current source 154 and a switch comprising a p-channel metal oxide semiconductor (PMOS) transistor 158 and a PMOS transistor 162. A source of the transistor 158 is coupled to the current source 154, and a drain of the transistor 158 is coupled to the summing line 120. A source of the transistor 162 is coupled to the current source 154, and a drain of the transistor 162 is coupled to ground. The cell 150 also includes logic 166 that receives the digital data that is to be converted and generates a switch control signal based on the digital data. The switch control signal is coupled to a gate of the transistor 158 and is coupled to an input of an inverter 170. An output of the inverter 170 is coupled to a gate of the transistor 162.

In operation, the logic 166 will generate either a low signal (e.g., 0 volts) or a high signal (e.g., 1.2 volts) depending upon a value of the digital data. If a value of the digital data results in the logic 166 generating a low signal, the transistor 158 will be turned ON. Additionally, the inverter 170 will generate a high signal, and thus the transistor 162 will be turned OFF. This will result in the current source 154 being coupled to the summing line 120. Thus, the current source 154 will supply its current to the summing line 120. On the other hand, if a value of the digital data results in the logic 166 generating a high signal, the transistor 158 will be turned OFF. Additionally, the inverter 170 will generate a low signal, and thus the transistor 162 will be turned ON. This will result in the current source 154 being coupled to ground. Thus, the current source 154 will not supply any of its current to the summing line 120.

SUMMARY OF THE DISCLOSURE

In accordance with one aspect of the disclosure, a circuit to convert a voltage range of a control signal comprises a first switch to selectively couple, based on the control signal, an output node to a first reference voltage when the output node is to be in a first state, and a second switch to selectively establish, based on the control signal, a second reference voltage when the output node is to be in a second state, the second state being a logical complement of the first state. The circuit also comprises a feedback control loop coupled to the output node to maintain the second reference voltage in response to voltage fluctuation at the output node. The feedback control loop includes a current mirror and a transistor coupled to the current mirror, wherein the transistor is controlled by feedback from the output node to modify a biasing current established by the current mirror to thereby counteract the voltage fluctuation.

In accordance with another aspect of the disclosure, a driving circuit to generate an output signal for a digital-to-analog converter cell in accordance with a control signal includes a first switch to selectively couple, based on the control signal, an output node to a first reference voltage when the output signal is to be in a first state. The driving circuit additionally includes a second switch to selectively establish, based on the control signal, a second reference voltage when the output signal is to be in a second state, the second state being a logical complement of the first state. The driving circuit further includes a feedback control loop coupled to the output node to maintain the second reference voltage in response to voltage fluctuation at the output node. The feedback control loop comprises a current mirror and first and second transistors coupled to the current mirror. The first transistor is coupled to the output node to be controlled by feedback from the output node to generate a bias voltage for the second transistor. The second transistor is coupled to the current mirror to modify current flow through a first branch of the current mirror in response to the feedback such that mirrored current through a second branch of the current mirror modifies a biasing current to counteract the voltage fluctuation.

In accordance with yet another aspect of the disclosure, a cell of a current-steering digital-to-analog converter includes a current source, and a p-channel metal oxide semiconductor (PMOS) transistor having a source coupled to the current source and a drain coupled to a current summing line. Also, the cell includes a driver circuit having a control input and an output node to drive a gate of the PMOS transistor. The driver circuit comprises a first switch to selectively couple, based on the control input, the output node to a first reference voltage when the cell is to be in a first state, and a diode coupled to the output node to establish, based on the control input, a second reference voltage for when the cell is to be in a second state, the second state being a logical complement of the first state. The driver circuit additionally comprises a feedback control loop coupled to the output node and the diode and comprising a current mirror to adjust a biasing current to be provided to the diode to counteract voltage fluctuation at the output node.

In accordance with still another aspect of the disclosure, a method for converting a voltage range of a control signal includes selectively coupling, based on the control signal, an output node to a first reference voltage when the output node is to be in a first state, and selectively establishing, based on the control signal, a second reference voltage when the output node is to be in a second state, the second state being a logical complement of the first state. Additionally, the method includes maintaining the second reference voltage in response to voltage fluctuation at the output node based on feedback from the output node.

In accordance with still another aspect of the disclosure, a circuit for converting a voltage range of a control signal comprises means for selectively coupling, based on the control signal, an output node to a first reference voltage when the output node is to be in a first state, and means for selectively establishing, based on the control signal, a second reference voltage when the output node is to be in a second state, the second state being a logical complement of the first state. The circuit additionally comprises means for maintaining the second reference voltage in response to voltage fluctuation at the output node.

BRIEF DESCRIPTION OF THE DRAWINGS

For a more complete understanding of the disclosure, reference should be made to the following detailed description and accompanying drawing figures, in which like reference numerals identify like elements in the figures, and in which.

DETAILED DESCRIPTION

Figure 1:
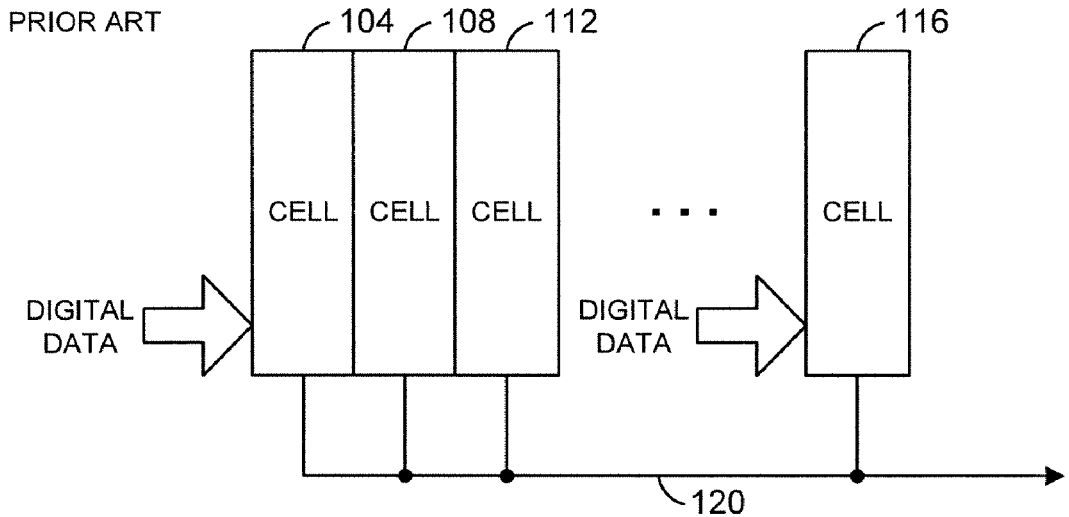
FIG. 1 a block diagram of an example current steering digital-to-analog converter (DAC)
Figure 2:
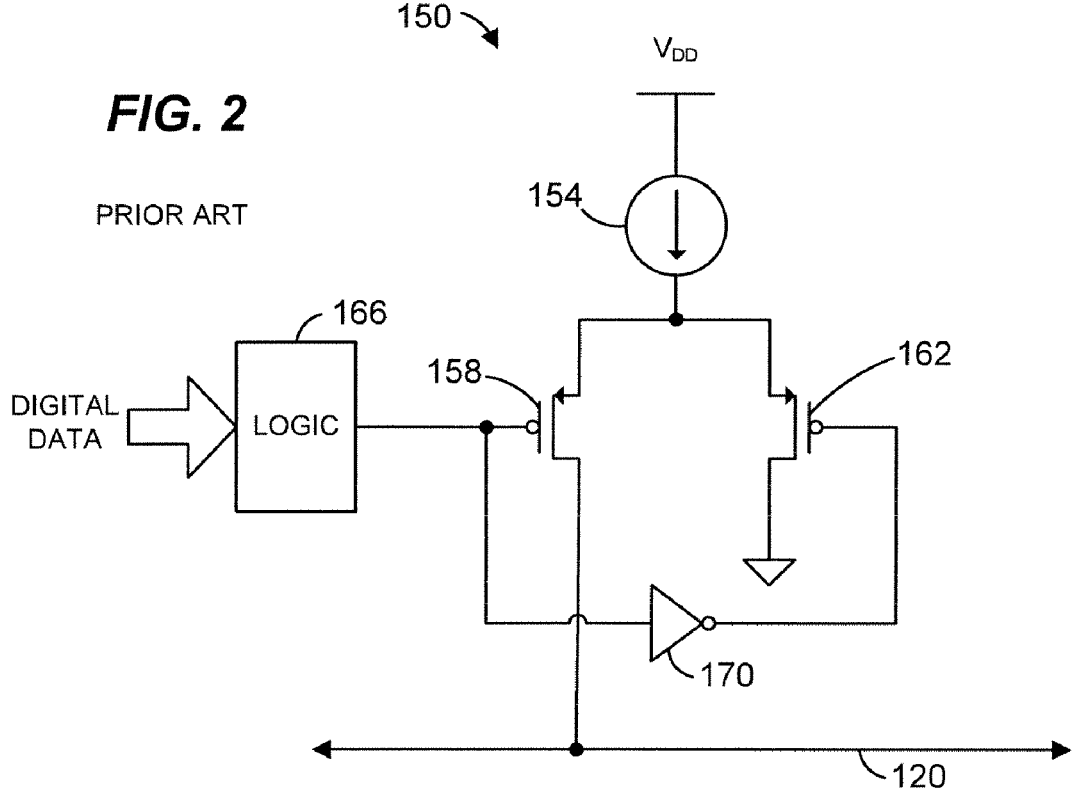
FIG. 2 is a circuit diagram of a cell of the current steering DAC of FIG. 1.
Figure 3:
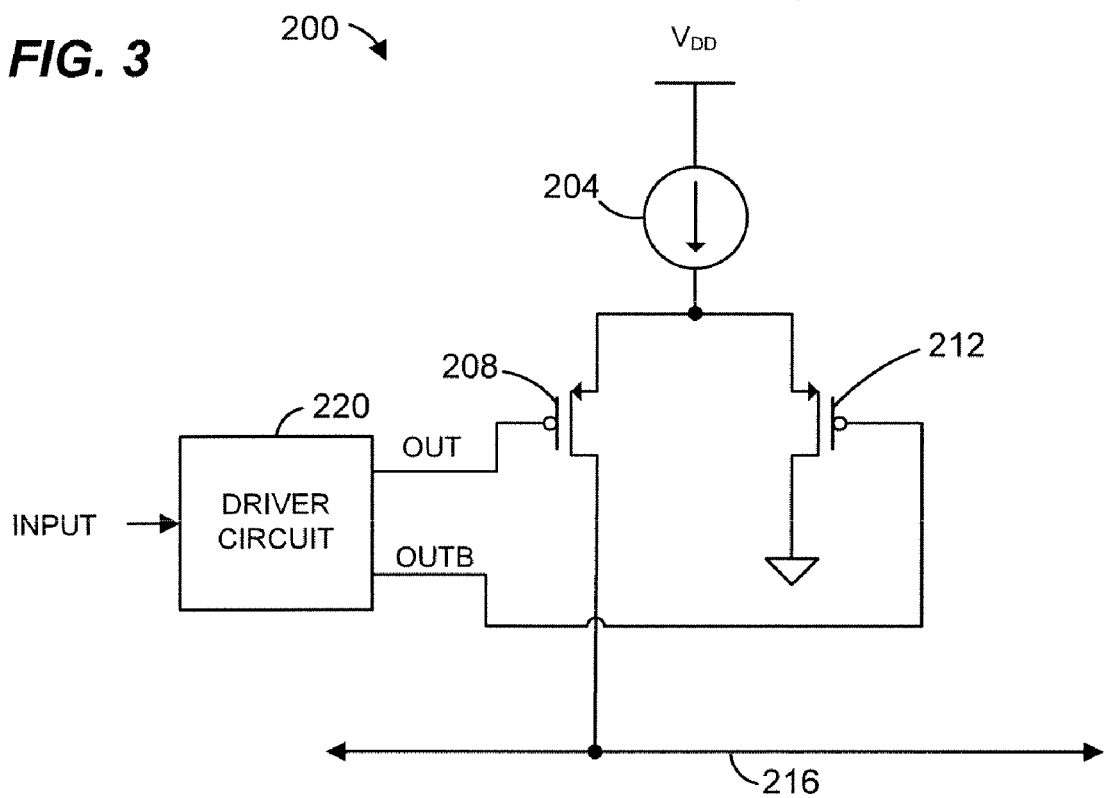
FIG. 3 is a circuit diagram of another cell that may be utilized in a current steering DAC.

FIG. 3 is a block diagram of an example cell 200 that may be utilized in a current steering DAC. The cell 200 includes a current source 204 and a switch comprising a p-channel metal oxide semiconductor (PMOS) transistor 208 and a PMOS transistor 212. A source of the transistor 208 is coupled to the current source 204, and a drain of the transistor 208 is coupled to a summing line 216. A source of the transistor 212 is coupled to the current source 204, and a drain of the transistor 212 is coupled to ground. The cell 200 also includes a driver circuit 220 that receives an input signal and generates two output signals based on the input signal. The input signal is indicative of whether the current source 204 should be coupled to or isolated from the summing line 216. The input signal may be generated by logic such as the logic block 166 of FIG. 2.

The two output signals control the transistors 208, 212 to selectively couple the current source 204 to the summing line 216. One of the output signals, OUT, is coupled to a gate of the transistor 208. The output signal, OUTB, is coupled to a gate of the transistor 212. The input signal coupled to the driving circuit 220 will vary between voltages levels for a typical CMOS device. For example, the input signal may vary between 0 volts and 1.2 volts. An input signal of approximately 0 volts may indicate that the current source 204 should be coupled to the summing line 216, and an input signal of approximately 1.2 volts may indicate that the current source 204 should be isolated from the summing line 216, for example. Alternatively, an input signal of approximately 1.2 volts may indicate that the current source 204 should be coupled to the summing line 216, and an input signal of approximately 0 volts may indicate that the current source 204 should be isolated from the summing line 216, for example.

The driving circuit 220 generates the output signals such that they vary in a range that is less than the range of that of the input signal. For example, if the input signal varies between approximately 0 volts and 1.2 volts, the output signals may vary between approximately 300 millivolts and 1.2 volts, for example, or some other desired range of reduced voltage range or swing. It has been found that, in at least some implementations, using such a reduced range reduces charge injection associated with the transistors 208, 212. It also has been found that, in at least some implementations, using such a reduced range tends to keep the transistors 208, 212 biased in a desired region, such as in saturation. In some cases, the reduced voltage range may desirably maintain a more constant output impedance for the cell of the current steering DAC.

In operation, when the input signal is HIGH (in the standard CMOS range), the driver circuit 220 will generate the signal OUT to be HIGH (in the reduced range) and will generate the signal OUTB to be LOW (in the reduced range). Similarly, when the input signal is LOW (in the standard CMOS range), the driver circuit 220 will generate the signal OUT to be LOW (in the reduced range) and will generate the signal OUTB to be HIGH (in the reduced range). As a specific example provided merely for explanatory purposes, if the input signal is 1.2 volts, the driver circuit 220 will generate the signal OUT to be 1.2 volts and will generate the signal OUTB to be 300 millivolts. Continuing with this example, if the input signal is 0 volts, the driver circuit 220 will generate the signal OUT to be 300 millivolts and will generate the signal OUTB to be 1.2 volts.

Figure 4:
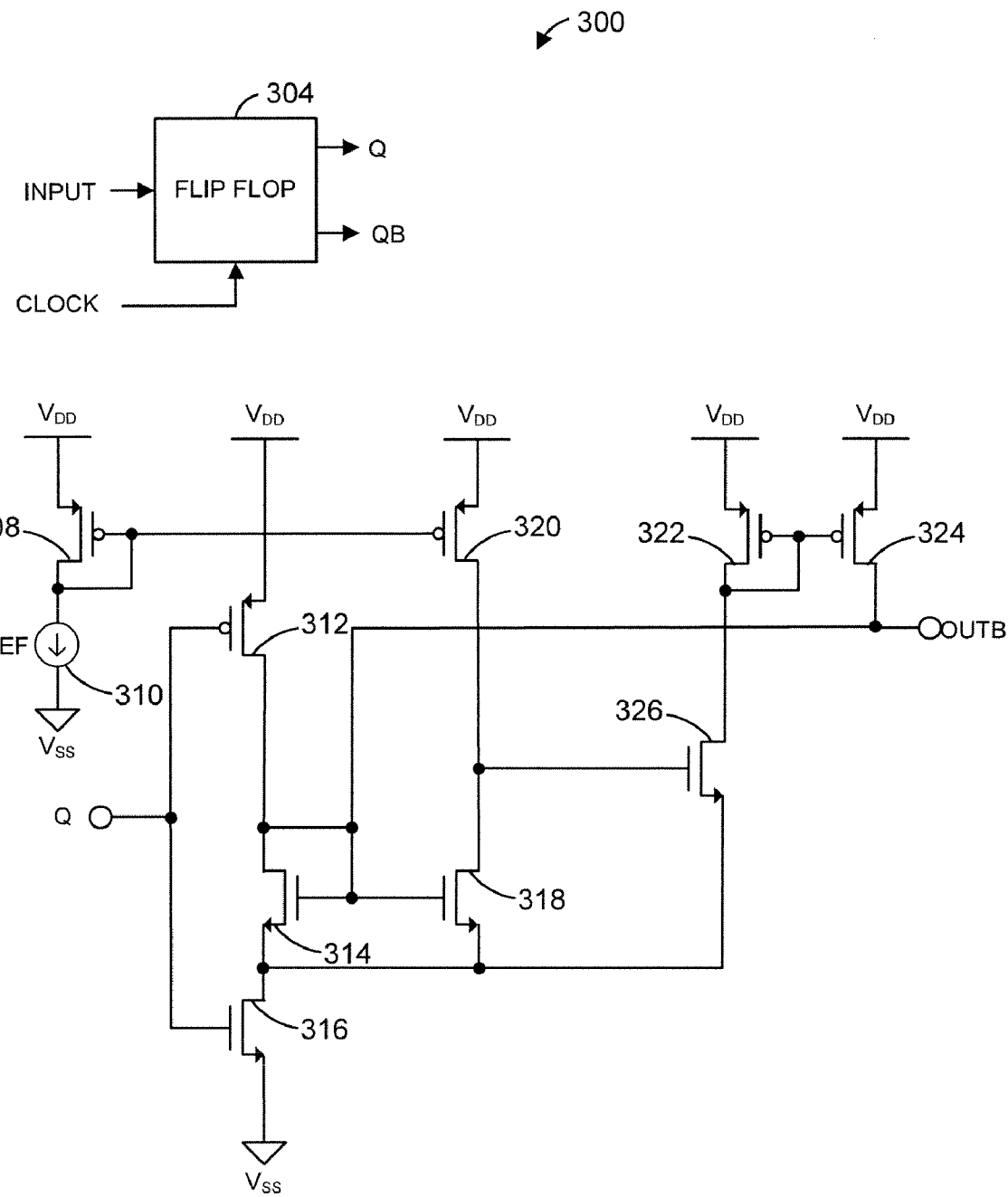
FIG. 4 is a circuit diagram of an example driver circuit that may be utilized in the cell of FIG. 3.

FIG. 4 is a circuit diagram of one example of a driving circuit 300 that may be used as the driving circuit 220 of FIG. 3. The driving circuit 300 includes a flip flop 304. The flip flop 304 includes a data input coupled to the input signal and a clock input coupled to a clock signal. The clock signal may be a clock signal of a DAC for example. The flip flop 304 generates a Q signal and a QB signal. In the embodiments described below, the Q signal corresponds with the input signal, while the QB signal corresponds to the logical complement of the input signal. In alternative embodiments, the Q signal corresponds to the logical complement of the input signal, and the QB signal corresponds to the input signal, as either the circuit nomenclature or, for instance, the logic 166 (FIG. 2) may be adjusted accordingly.

The driving circuit 300 also includes a PMOS transistor 308 having a source coupled to a reference voltage $V_{DD}$, a drain coupled to a current source 310, and a gate tied to the drain. The reference voltage $V_{DD}$ may be 1.2 volts, for example, or any other suitable reference voltage. A PMOS transistor 312 has a source coupled to $V_{DD}$, a drain coupled to a drain of an n-channel metal oxide semiconductor (NMOS) transistor 314, and a gate coupled to the Q signal. The transistor 314 has its gate tied to its drain such that, in operation, the transistor is arranged as a forward-biased diode in accordance with the current flow. The Q signal is also coupled to the gate of an NMOS transistor 316, which has a source coupled to $V_{SS}$, and a drain coupled to the source of the transistor 314. The reference voltage $V_{SS}$ may be ground, for example, or any other suitable reference voltage. A pair of PMOS transistors 322 and 324 are arranged as a current mirror. When the transistor 316 is ON, the current mirror that includes the transistors 322 and 324 provides a biasing current for the transistor 314.

The gate of the transistor 314 is coupled to the OUTB node, as is the gate of an NMOS transistor 318, which also shares a common source with the transistor 314. The drain of the transistor 318 is coupled to the drain of a PMOS transistor 320, which is configured as one-half of a current mirror formed with the transistor 308. The source of the transistor 320 is coupled to $V_{DD}$.

The transistor 318 may be considered a part of a feedback loop that interacts with the transistor 314 to compensate for (i.e., counteract) voltage fluctuations on the OUTB node. As described below, the OUTB node may exhibit dynamic behavior associated with the capacitive coupling between the driving circuit 300 and the remainder of the current steering DAC. The feedback loop includes a pair of PMOS transistors 322 and 324 arranged as a current mirror. The branch of the current mirror having the transistor 322 sources an NMOS transistor 326, while the other branch of the current mirror (i.e., having the transistor 324) provides the biasing current to the transistor 314. More specifically, and as shown in FIG. 4, the drain of the transistor 322 is coupled to the drain of the transistor 326. The gate of the transistor 326, in turn, is coupled to the node defined by the connection of the transistors 320 and 318.

In some embodiments, the driving circuit 300 further includes an identical circuit for generating a logic signal on a node OUT based on the QB signal. That is, the driving circuit 300 shown in FIG. 4 may correspond with only half of the driving circuit utilized to generate the logic signals on separate OUT and OUTB nodes.

Operation of the driving circuit 300 will now be described. First, assume that the Q signal is LOW, and the QB signal is HIGH. In this state, the transistor 312 is ON, and the transistor 316 is OFF. Thus, the transistor 312 acts as a switch to pull up the node OUTB to approximately $V_{DD}$. In cases with a circuit complementary to the circuit 300, the QB signal is HIGH, thereby turning the transistor 312 OFF, and the transistor 316 ON. In this event, and as will be described in more detail below, the transistor 316 acts as a switch such that the output node is drawn down toward $V_{SS}$, to a desired voltage above $V_{SS}$. This voltage will be referred to as $V_{MIN}$.

With reference again to the driving circuit of FIG. 4, when the Q signal transitions to HIGH, the transistor 312 will turn OFF and the transistor 316 will turn ON. This will cause the OUTB node to discharge toward $V_{SS}$ via the discharge path formed by the transistors 314 and 316. The degree to which the transistor 314 is forward biased as a diode establishes the resulting desired voltage $V_{MIN}$. The amount of current flowing through the transistor 314 thus affects the gate-to-source voltage ($V_{GS}$) of the transistor 314. The eventual voltage $V_{MIN}$ established for the node OUTB will accordingly approximate $V_{GS}$ of the transistor 314. The node OUTB can be made to fall to the desired voltage $V_{MIN}$ by appropriately selecting the transistor 314. A biasing current for the transistor 314 is set by the current mirror that includes the transistors 322 and 324. Additionally, the node OUTB is maintained at the desired voltage $V_{MIN}$ by the operation of the feedback loop and the quiescent current flowing through the transistor 320, as described below. The supporting quiescent current is, in turn, established via the current mirror formed by the transistors 308 and 320, and determined by the current IREF specified by the current source 310. In one specific implementation, the voltage $V_{MIN}$ may be approximately 300 millivolts. It is to be understood, however, that other values of $V_{MIN}$ may be utilized as well. For example, the voltage $V_{MIN}$ may be approximately 100 millivolts, 125 millivolts, 150 millivolts, 175 millivolts, 200 millivolts, 225 millivolts, 250 millivolts, 275 millivolts, 325 millivolts, 350 millivolts, etc.

When the driving circuit 300 resides in the state with the Q signal HIGH, the transistors 308 and 320 act as a current mirror to establish the quiescent current through the transistor 318, as well as the gate voltage for the transistor 326. The gate voltage for the transistor 326 is determined via the feedback control loop formed by the transistors 318 and 326, and the current mirror having the transistors 322 and 324. Generally speaking, the feedback control loop reacts to fluctuations of the voltage on the OUTB node to maintain a constant current flowing through the transistor 314, and thereby counteract the output node fluctuations.

If the OUTB node is tending to increase, the transistor 318 starts to pull the gate of the transistor 326 closer to $V_{SS}$, such that the current flowing through the branch having the transistors 322 and 326 decreases. This decrease is matched in the mirrored current through the transistor 324 in the other branch of the current mirror and, as a result, the current biasing the transistor 314 decreases. The $V_{GS}$ of the transistor 314 accordingly starts to fall, thereby counteracting the initial tendency of the voltage on the OUTB node to increase.

Conversely, if the OUTB node is starting to decrease, the gate of the transistor 326 is provided a higher voltage, such that the current flowing through both branches of the current mirror formed by the transistors 322 and 324 increases. With the biasing current to the transistor 314 now increasing, the $V_{GS}$ of the transistor 314 begins to increase to compensate for, and counteract, the initial decrease at the OUTB node.

Through these adjustments, the feedback control loop supports the current flowing through the biasing transistor 314, thereby maintaining a constant $V_{MIN}$. In so doing, the feedback control loop also helps to avoid output node fluctuations that would otherwise undesirably increase the output impedance of the driving circuit 300. Fluctuations of the output node voltage may otherwise occur because the OUTB node is capacitively coupled to the output of the DAC 100, which exhibits a dynamic voltage. If, as a result of the fluctuations, the current through the transistor 314 were to decrease dramatically, the impedance of the OUTB node would correspondingly increase to levels that may, for instance, detrimentally slow the transitions between logic states.

The continued operation of the feedback control loop while the driving circuit is in the LOW state may be supported by a very low quiescent current set by the current source 310. For example, the quiescent current flowing through the transistors 318 and 320 may be about 0.5 µA. In other embodiments, the quiescent current may fall within the range from about 1 µA to about 5 µA. In still other embodiments, the quiescent current may fall within the range from about 0.4 µA to about 5 µA.

One of ordinary skill in the art will recognize many variations to the example circuit 300 are possible. For example, the flip-flop 304 may be omitted and/or replaced with circuitry generating complementary Q and QB signals. As another example, the example circuit 300 (or variations thereof) is not limited to implementation in a configuration in which the output node OUTB is generated by the input signal Q, but rather may, for instance, be implemented such that the principal output generated by the circuit 300 is the OUT signal.

A circuit such as described above may be utilized in a variety of devices that require the conversion of a logic signal into a signal having a reduced range. As just one example, such a circuit may be utilized in current steering DACs. More generally, such a circuit may be utilized in a variety of electronic devices such as communication devices, computation devices, storage devices, networking devices, measurement devices, etc. Referring now to FIGS. 5A-5H, a few specific examples of devices that may utilize a circuit such as such as the circuit 300 will be described.

Figure 5A:
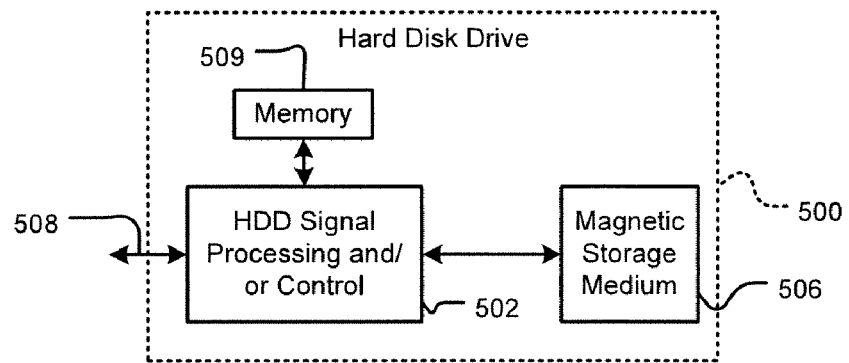
FIG. 5A is a block diagram of a hard disk drive system that may utilize a circuit such as the circuit of FIG. 4.

For example, referring to FIG. 5A, a hard disk drive 500 may include a circuit such as the circuit 300. For example, signal processing and/or control circuits, which are generally identified in FIG. 5A at 502, may include a circuit such as the circuit 300. For instance, signal processing and/or control circuits 502 may include one or more current steering DACs. In some implementations, signal processing and/or control circuit 502 and/or other circuits (not shown) in HDD 500 may process data, perform coding and/or encryption, perform calculations, and/or format data that is output to and/or received from a magnetic storage medium 506.

HDD 500 may communicate with a host device (not shown) such as a computer, mobile computing devices such as personal digital assistants, cellular phones, media or MP3 players and the like, and/or other devices via one or more wired or wireless communication links 508. HDD 500 may be connected to memory 509, such as random access memory (RAM), a nonvolatile memory such as flash memory, read only memory (ROM) and/or other suitable electronic data storage.

Figure 5B:
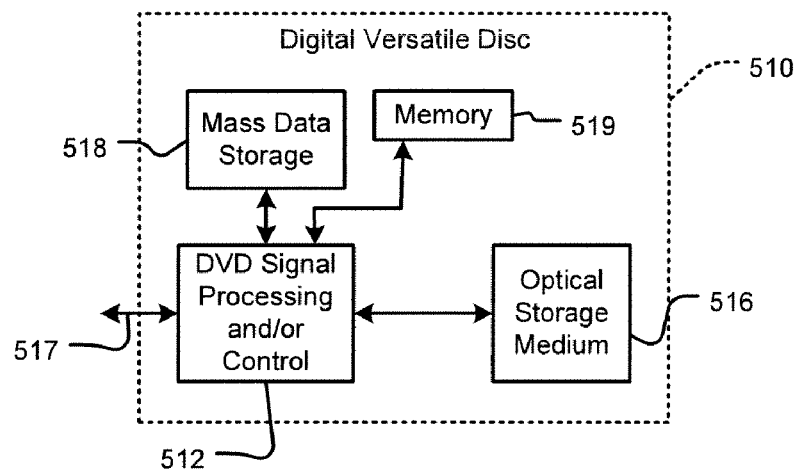
FIG. 5B is a block diagram of a digital versatile drive system that may utilize a circuit such as the circuit of FIG. 4.

Referring now to FIG. 5B, a circuit such as the circuit 300 may be utilized in a digital versatile disc (DVD) drive 510. A circuit such as the circuit 300 may be utilized in either or both signal processing and/or control circuits, which are generally identified in FIG. 5B at 512, and/or mass data storage 518 of DVD drive 510. For instance, signal processing and/or control circuits 512 and/or the mass storage device 518 may include one or more current steering DACs. Signal processing and/or control circuit 512 and/or other circuits (not shown) in DVD 510 may process data, perform coding and/or encryption, perform calculations, and/or format data that is read from and/or data written to an optical storage medium 516. In some implementations, signal processing and/or control circuit 512 and/or other circuits (not shown) in DVD 510 can also perform other functions such as encoding and/or decoding and/or any other signal processing functions associated with a DVD drive.

DVD drive 510 may communicate with an output device (not shown) such as a computer, television or other device via one or more wired or wireless communication links 517. DVD 510 may communicate with mass data storage 518 that stores data in a nonvolatile manner. Mass data storage 518 may include a hard disk drive (HDD) such as that shown in FIG. 5B. The HDD may be a mini HDD that includes one or more platters having a diameter that is smaller than approximately 1.8". DVD 510 may be connected to memory 519, such as RAM, ROM, nonvolatile memory such as flash memory, and/or other suitable electronic data storage.

Figure 5C:
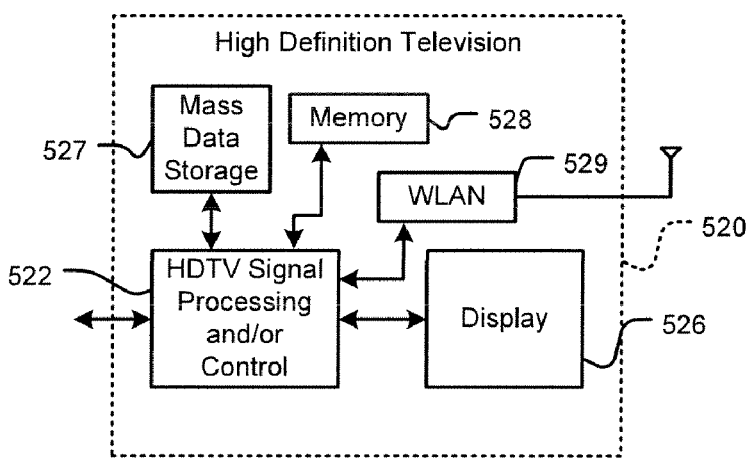
FIG. 5C is a block diagram of a high definition television that may utilize a circuit such as the circuit of FIG. 4.

Referring to FIG. 5C, a circuit such as the circuit 300 may be utilized in a high definition television (HDTV) 520. The HDTV 520 includes signal processing and/or control circuits, which are generally identified in FIG. 5C at 522, a WLAN interface 529, and a mass data storage 527. A circuit such as the circuit 300 may be utilized in the WLAN interface 529 or the signal processing circuit and/or control circuit 522, for example. For instance, the WLAN interface 529 and/or signal processing and/or control circuits 522 may include one or more current steering DACs. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with mass data storage 527 that stores data in a nonvolatile manner such as optical and/or magnetic storage devices. The mass data storage 527 may include one or more hard disk drives (HDDs) and/or one or more digital versatile disks (DVDs). At least one HDD may have the configuration shown in FIG. 5A and/or at least one DVD may have the configuration shown in FIG. 5B. One or more of the HDDs may be a mini HDD that includes one or more platters having a diameter that is smaller than approximately 1.8". HDTV 520 may be connected to memory 528 such as RAM, ROM, nonvolatile memory such as flash memory and/or other suitable electronic data storage. HDTV 520 also may support connections with a WLAN via a WLAN network interface 529.

Figure 5D:
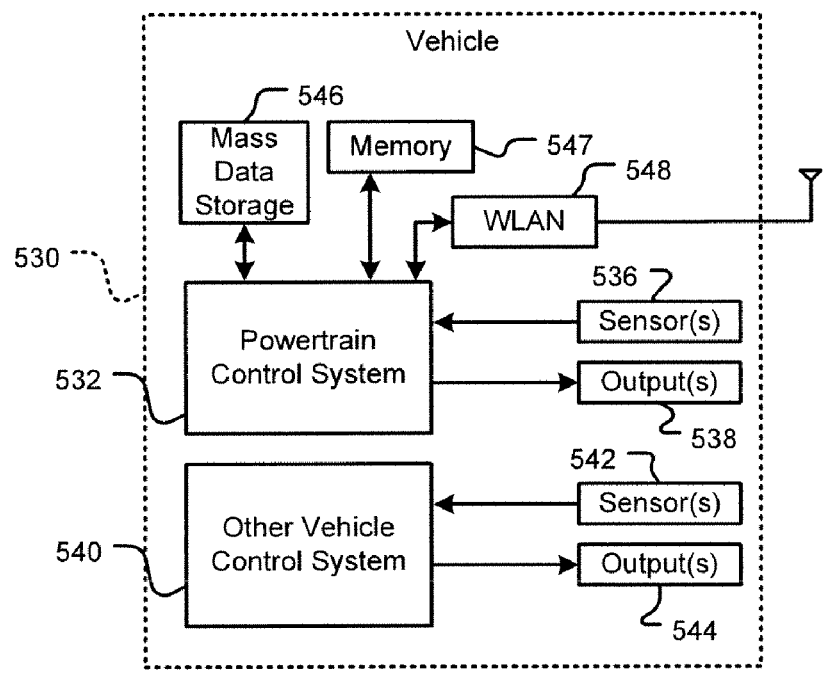
FIG. 5D is a block diagram of a vehicle that may utilize a circuit such as the circuit of FIG. 4.

Referring now to FIG. 5D, a circuit such as the circuit 300 may be utilized in a control system of a vehicle 530. In some implementations, a circuit such as the circuit 300 may be utilized by a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals. For instance, the powertrain control system 532 may include one or more current steering DACs.

A circuit such as the circuit 300 may be utilized in other control systems 540 of vehicle 530. For instance, control systems 540 may include one or more current steering DACs. Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 532 may communicate with mass data storage 546 that stores data in a nonvolatile manner. Mass data storage 546 may include optical and/or magnetic storage devices for example hard disk drives HDD and/or DVDs. At least one HDD may have the configuration shown in FIG. 5A and/or at least one DVD may have the configuration shown in FIG. 5B. One or more of the HDDs may be a mini HDD that includes one or more platters having a diameter that is smaller than approximately 1.8". Powertrain control system 532 may be connected to memory 547 such as RAM, ROM, nonvolatile memory such as flash memory and/or other suitable electronic data storage. Powertrain control system 532 also may support connections with a WLAN via a WLAN network interface 548. The WLAN interface 548 may include a circuit such as the circuit 300. For instance, the WLAN interface 548 may include one or more current steering DACs. The control system 540 may also include mass data storage, memory and/or a WLAN interface (all not shown).

Figure 5E:
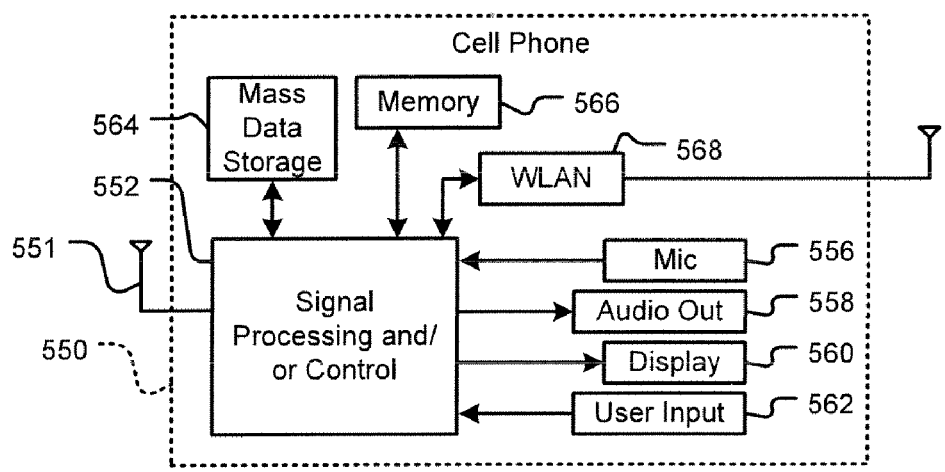
FIG. 5E is a block diagram of a cellular phone that may utilize a circuit such as the circuit of FIG. 4.

Referring now to FIG. 5E, a circuit such as the circuit 300 may be utilized in a cellular phone 550 that may include a cellular antenna 551. The cellular phone 550 includes signal processing and/or control circuits, which are generally identified in FIG. 5E at 552, a WLAN interface 568, and a mass data storage 564. A circuit such as the circuit 300 may be utilized in the signal processing and/or control circuits 552 and/or the WLAN interface 568, for example. For instance, the signal processing and/or control circuits and/or the WLAN interface 568 may include one or more current steering DACs. In some implementations, cellular phone 550 includes a microphone 556, an audio output 558 such as a speaker and/or audio output jack, a display 560 and/or an input device 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. At least one HDD may be a mini HDD that includes one or more platters having a diameter that is smaller than approximately 1.8". Cellular phone 550 may be connected to memory 566 such as RAM, ROM, nonvolatile memory such as flash memory and/or other suitable electronic data storage. Cellular phone 550 also may support connections with a WLAN via a WLAN network interface 568.

Figure 5F:
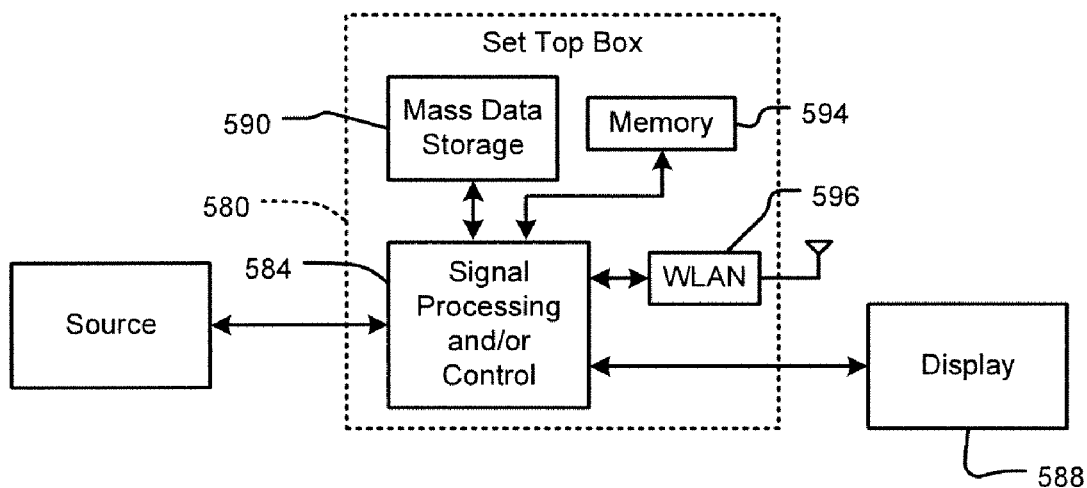
FIG. 5F is a block diagram of a set top box that may utilize a circuit such as the circuit of FIG. 4.

Referring now to FIG. 5F, a circuit such as the circuit 300 may be utilized in a set top box 580. The set top box 580 includes signal processing and/or control circuits, which are generally identified in FIG. 5F at 584, a WLAN interface 596, and a mass data storage device 590. A circuit such as the circuit 300 may be utilized in the signal processing and/or control circuits 584 and/or the WLAN interface 596, for example. For instance, the signal processing and/or control circuits 584 and/or the WLAN interface 596 may include one or more current steering DACs. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set top box 580 may process data, perform coding and/or encryption, perform calculations, format data and/or perform any other set top box function.

Set top box 580 may communicate with mass data storage 590 that stores data in a nonvolatile manner. Mass data storage 590 may include optical and/or magnetic storage devices for example hard disk drives HDD and/or DVDs. At least one HDD may have the configuration shown in FIG. 5A and/or at least one DVD may have the configuration shown in FIG. 5B. At least one HDD may be a mini HDD that includes one or more platters having a diameter that is smaller than approximately 1.8". Set top box 580 may be connected to memory 594 such as RAM, ROM, nonvolatile memory such as flash memory and/or other suitable electronic data storage. Set top box 580 also may support connections with a WLAN via a WLAN network interface 596.

Figure 5G:
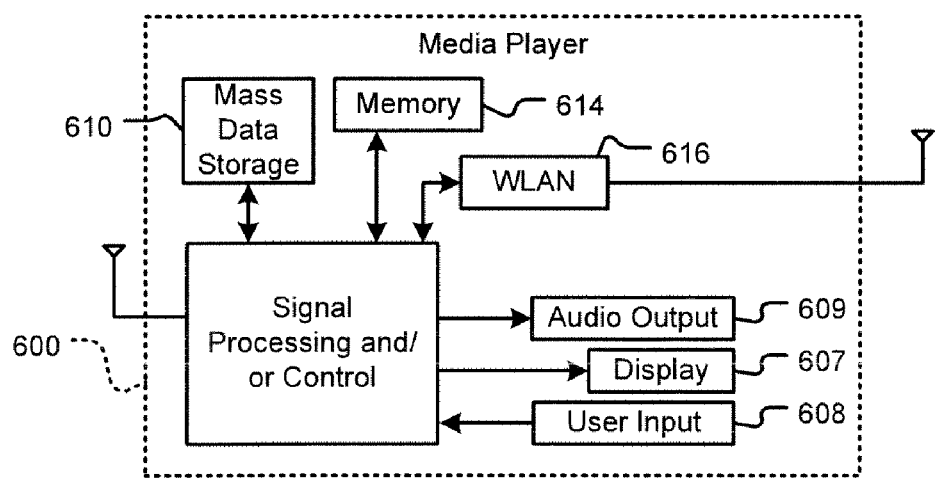
FIG. 5G is a block diagram of a media player that may utilize a circuit such as the circuit of FIG. 4.

Referring now to FIG. 5G, a circuit such as the circuit 300 may be utilized in a media player 600. The media player 600 may include signal processing and/or control circuits, which are generally identified in FIG. 5G at 604, a WLAN interface 616, and a mass data storage device 610. A circuit such as the circuit 300 may be utilized in the signal processing and/or control circuits 604 and/or the WLAN interface 616, for example. For instance, the signal processing and/or control circuits 604 and/or the WLAN interface 616 may include one or more current steering DACs. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5A and/or at least one DVD may have the configuration shown in FIG. 5B. At least one HDD may be a mini HDD that includes one or more platters having a diameter that is smaller than approximately 1.8". Media player 600 may be connected to memory 614 such as RAM, ROM, nonvolatile memory such as flash memory and/or other suitable electronic data storage. Media player 600 also may support connections with a WLAN via a WLAN network interface 616. Still other implementations in addition to those described above are contemplated.

Figure 5H:
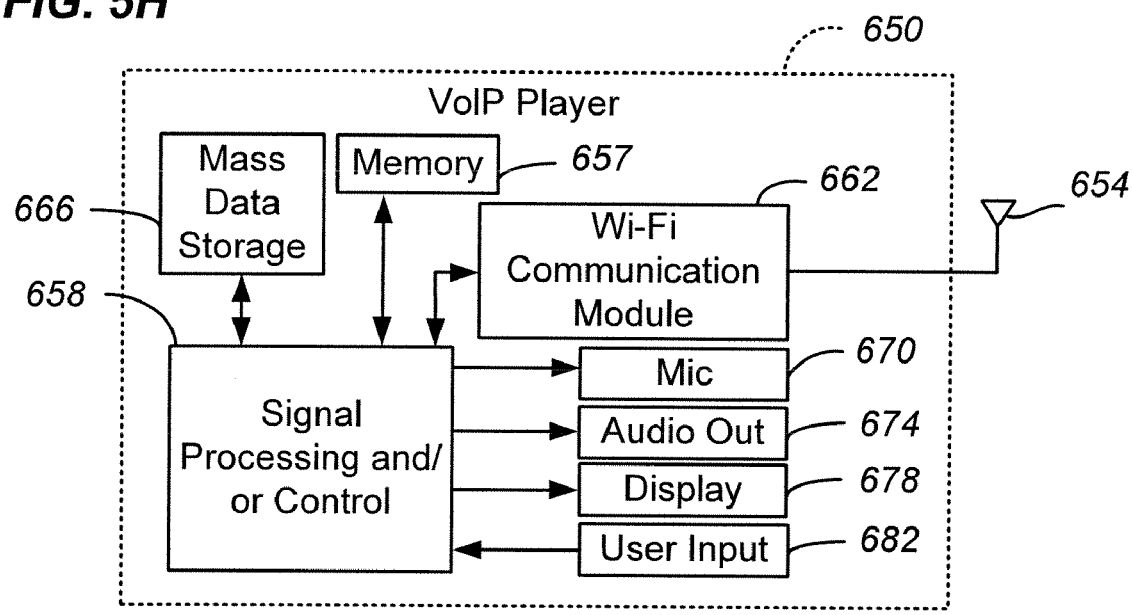
FIG. 5H is a block diagram of a voice over IP device that may utilize a circuit such as the circuit of FIG. 4.

Referring to FIG. 5H, a circuit such as the circuit 300 may be utilized in a Voice over Internet Protocol (VoIP) phone 650 that may include an antenna 654, signal processing and/or control circuits 658, a wireless interface 662, and a mass data storage 666. A circuit such as the circuit 300 may be utilized in the signal processing and/or control circuits 658 and/or the wireless interface 662, for example. For instance, the signal processing and/or control circuits 658 and/or the wireless interface 662 may include one or more current steering DACs. In some implementations, VoIP phone 650 includes, in part, a microphone 670, an audio output 674 such as a speaker and/or audio output jack, a display monitor 678, an input device 682 such as a keypad, pointing device, voice actuation and/or other input devices, and a Wireless Fidelity (Wi-Fi) communication module 662. Signal processing and/or control circuits 658 and/or other circuits (not shown) in VoIP phone 650 may process data, perform coding and/or encryption, perform calculations, format data and/or perform other VoIP phone functions.

VoIP phone 650 may communicate with mass data storage 666 that stores data in a nonvolatile manner such as optical and/or magnetic storage devices, for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". VoIP phone 650 may be connected to memory 686, which may be a RAM, ROM, nonvolatile memory such as flash memory and/or other suitable electronic data storage. VoIP phone 650 is configured to establish communications link with a VoIP network (not shown) via Wi-Fi communication module 662.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A circuit to convert a voltage range of a control signal, the circuit comprising:
    a first switch to selectively couple, based on the control signal, an output node to a first reference voltage when the output node is to be in a first state;
    a second switch to selectively establish, based on the control signal, a second reference voltage when the output node is to be in a second state, the second state being a logical complement of the first state; and
    a feedback control loop coupled to the output node to maintain the second reference voltage in response to voltage fluctuation at the output node, the feedback control loop comprising a current mirror and a transistor coupled to the current mirror, wherein the transistor is controlled by feedback from the output node to modify a biasing current established by the current mirror to thereby counteract the voltage fluctuation.

2. A circuit according to claim 1, wherein the transistor is coupled to the output node such that the feedback is provided from the output node as a bias voltage for the transistor.

3. A circuit according to claim 1, wherein the feedback control loop comprises a further transistor coupled to the transistor and the current mirror to receive mirrored current flow through a first branch of the current mirror.

4. A circuit according to claim 3, wherein the transistor is coupled to the further transistor such that the feedback via the transistor coupled to the current mirror changes the mirrored current flow through the first branch of the current mirror.

5. A circuit according to claim 4, further comprising a diode coupled to the output node and a second branch of the current mirror to receive mirrored current flow through the second branch to establish the second reference voltage, wherein the diode and the transistor coupled to the current mirror are coupled to receive the feedback from the output node.

6. A circuit according to claim 5, wherein the diode comprises an n-channel metal oxide semiconductor (NMOS) transistor having a gate and a drain, each of which is coupled to the output node to receive the feedback.

7. A circuit according to claim 1, wherein the transistor is coupled to a further current mirror to receive a quiescent current and thereby generate a bias voltage for a further transistor of the feedback control loop.

8. A driving circuit to generate an output signal for a digital-to-analog converter cell in accordance with a control signal, the driving circuit comprising:
    a first switch to selectively couple, based on the control signal, an output node to a first reference voltage when the output signal is to be in a first state;
    a second switch to selectively establish, based on the control signal, a second reference voltage when the output signal is to be in a second state, the second state being a logical complement of the first state; and
    a feedback control loop coupled to the output node to maintain the second reference voltage in response to voltage fluctuation at the output node, the feedback control loop comprising a current mirror and first and second transistors coupled to the current mirror, wherein:
    the first transistor is coupled to the output node to be controlled by feedback from the output node to generate a bias voltage for the second transistor;
    the second transistor is coupled to the current mirror to modify current flow through a first branch of the current mirror in response to the feedback such that mirrored current through a second branch of the current mirror modifies a biasing current to counteract the voltage fluctuation.

9. A circuit according to claim 8, wherein the first transistor is coupled to the output node such that the feedback is provided from the output node as a gate voltage for the first transistor.

10. A circuit according to claim 8, further comprising a diode coupled to the output node and the second branch of the current mirror to receive the mirrored current through the second branch to establish the second reference voltage.

11. A circuit according to claim 10, wherein the diode is a third transistor arranged as a diode.

12. A circuit according to claim 10, wherein the diode and the first transistor are coupled to receive the feedback from the output node.

13. A circuit according to claim 12, wherein the diode comprises an n-channel metal oxide semiconductor (NMOS) transistor having a gate and a drain, each of which is coupled to the output node to receive the feedback.

14. A circuit according to claim 8, wherein the first transistor is coupled to a further current mirror to receive a quiescent current and thereby generate a bias voltage for the second transistor.

15. A cell of a current-steering digital-to-analog converter, comprising:
    a current source;
    a p-channel metal oxide semiconductor (PMOS) transistor having a source coupled to the current source and a drain coupled to a current summing line; and
    a driver circuit having a control input and an output node to drive a gate of the PMOS transistor, the driver circuit comprising:
    a first switch to selectively couple, based on the control input, the output node to a first reference voltage when the cell is to be in a first state;
    a diode coupled to the output node to establish, based on the control input, a second reference voltage for when the cell is to be in a second state, the second state being a logical complement of the first state; and
    a feedback control loop coupled to the output node and the diode and comprising a current mirror to adjust a biasing current to be provided to the diode to counteract voltage fluctuation at the output node.

16. A method for converting a voltage range of a control signal, the method comprising:
    selectively coupling, based on the control signal, an output node to a first reference voltage when the output node is to be in a first state;
    selectively establishing, based on the control signal, a second reference voltage when the output node is to be in a second state, the second state being a logical complement of the first state; and
    maintaining the second reference voltage in response to voltage fluctuation at the output node based on feedback from the output node.

17. A method according to claim 16, wherein maintaining the second reference voltage comprises modifying a biasing current of a current mirror coupled to the output node.

18. A method according to claim 17, wherein modifying the biasing current of the current mirror comprises controlling, using the feedback, a transistor coupled to the current mirror.

19. A method according to claim 18, wherein controlling the transistor comprises changing a gate voltage of the transistor in response to voltage changes of the output node.

20. A circuit for converting a voltage range of a control signal, the circuit comprising:
    means for selectively coupling, based on the control signal, an output node to a first reference voltage when the output node is to be in a first state;
    means for selectively establishing, based on the control signal, a second reference voltage when the output node is to be in a second state, the second state being a logical complement of the first state; and
    means for maintaining the second reference voltage in response to voltage fluctuation at the output node.

21. A circuit according to claim 20, wherein the means for maintaining the second reference voltage comprises:
    a current mirror that generates a biasing current; and
    means coupled to the current mirror for modifying the biasing current of the current mirror.

22. A circuit according to claim 21, wherein the means for selectively establishing includes a transistor coupled to the output node and the current mirror, the transistor biased with the biasing current;
    wherein the means for modifying the biasing current comprises feedback means coupled between the output node and the current mirror.

* * * * *